United States Patent
Aboudina et al.

(10) Patent No.: US 11,177,988 B2
(45) Date of Patent: Nov. 16, 2021

(54) RECEIVER CIRCUITS WITH BLOCKER ATTENUATING MIXER

(71) Applicant: SHENZHEN GOODIX TECHNOLOGY CO., LTD., Shenzhen (CN)

(72) Inventors: Mohamed Aboudina, San Diego, CA (US); Ahmed Emira, San Diego, CA (US); Esmail Babakrpur Nalousi, San Diego, CA (US)

(73) Assignee: SHENZHEN GOODIX TECHNOLOGY CO., LTD., Shenzhen (CN)

( * ) Notice: Subject to any disclaimer, the term of this patent is extended or adjusted under 35 U.S.C. 154(b) by 7 days.

(21) Appl. No.: 16/749,994

(22) Filed: Jan. 23, 2020

(65) Prior Publication Data
US 2021/0234736 A1   Jul. 29, 2021

(51) Int. Cl.
*H04L 27/14*   (2006.01)
*H04B 1/16*   (2006.01)
(Continued)

(52) U.S. Cl.
CPC .............. *H04L 27/14* (2013.01); *H03F 3/19* (2013.01); *H03G 3/3036* (2013.01); *H04B 1/12* (2013.01);
(Continued)

(58) Field of Classification Search
CPC ...... H04B 1/16; H04B 1/12; H03G 2201/103; H03G 3/3036; H03G 2201/307;
(Continued)

(56) References Cited

U.S. PATENT DOCUMENTS 7,271,640 B2 *  9/2007  Bargroff ................... H03D 7/00
                                                    327/356
8,476,952 B2 *  7/2013  Shimizu ............... H03D 7/1466
                                                    327/231
(Continued)

FOREIGN PATENT DOCUMENTS

CN         106982040 A       7/2017
EP           2698923 A1 *    2/2014  .......... H04B 1/1036
TW         201939908 A      10/2019

OTHER PUBLICATIONS

Sedighi, S., Hashemipour, O., & Dousti, M, 2.4-GHz Highly Linear Derivative Superposition Gilbert Cell Mixer, 2016, Turkish Journal of Electrical Engineering & Computer Sciences, 24(2), 571-9. doi:http://dx.doi.org/10.3906/elk-1307-80 (Year: 2016).*

*Primary Examiner* — Lana N Le
(74) *Attorney, Agent, or Firm* — Kilpatrick Townsend & Stockton LLP

(57) ABSTRACT

A receiver circuit is disclosed. The receiver circuit includes an amplifier having an input terminal, where the amplifier is configured to generate an RF signal based on a signal received at the input terminal, where the RF signal includes an information signal and a blocker signal modulating an RF carrier frequency. The receiver circuit also includes a mixer configured to receive the RF signal and to downconvert the RF signal to generate a baseband signal, where the baseband signal includes the information signal and the blocker signal modulating a baseband carrier frequency, where the baseband carrier frequency is less than the RF carrier frequency, and where the mixer is further configured to selectively attenuate the blocker signal.

18 Claims, 2 Drawing Sheets

(51) Int. Cl.
*H04B 1/12* (2006.01)
*H03F 3/19* (2006.01)
*H03G 3/30* (2006.01)

(52) U.S. Cl.
CPC ......... *H04B 1/16* (2013.01); *H03F 2200/165* (2013.01); *H03F 2200/171* (2013.01); *H03F 2200/294* (2013.01); *H03F 2200/451* (2013.01); *H03G 2201/103* (2013.01); *H03G 2201/307* (2013.01)

(58) Field of Classification Search
CPC ......... H03F 2200/451; H03F 2200/165; H03F 2200/294; H03F 2200/171; H03F 3/19; H04L 27/14
See application file for complete search history.

(56) References Cited

U.S. PATENT DOCUMENTS

| | | | | |
|---|---|---|---|---|
| 8,655,299 | B2* | 2/2014 | Mirzaei | H03F 1/083 |
| | | | | 455/307 |
| 9,362,889 | B2* | 6/2016 | Kitsunezuka | H03H 11/12 |
| 10,873,486 | B1* | 12/2020 | Aboudina | H04B 1/12 |
| 2002/0097081 | A1* | 7/2002 | Razavi | H03D 3/008 |
| | | | | 327/307 |
| 2005/0026583 | A1 | 2/2005 | Carpineto et al. | |
| 2006/0091948 | A1* | 5/2006 | Darabi | H03G 1/007 |
| | | | | 330/132 |
| 2007/0176682 | A1* | 8/2007 | Nakamura | H03G 1/0088 |
| | | | | 330/278 |
| 2007/0264943 | A1* | 11/2007 | Darabi | H04B 1/123 |
| | | | | 455/88 |
| 2007/0287400 | A1* | 12/2007 | Yu | H03G 3/3068 |
| | | | | 455/232.1 |
| 2010/0120369 | A1* | 5/2010 | Ko | H03D 7/168 |
| | | | | 455/67.11 |
| 2013/0039444 | A1* | 2/2013 | Porret | H04B 1/006 |
| | | | | 375/316 |
| 2013/0057350 | A1* | 3/2013 | Riekki | H03F 3/211 |
| | | | | 330/291 |
| 2014/0073280 | A1 | 3/2014 | Mikhemar et al. | |
| 2014/0141741 | A1* | 5/2014 | Mikhemar | H04B 1/109 |
| | | | | 455/306 |
| 2014/0155013 | A1* | 6/2014 | Murphy | H03F 1/0277 |
| | | | | 455/256 |
| 2014/0171003 | A1* | 6/2014 | Mikhemar | H03F 3/45179 |
| | | | | 455/232.1 |
| 2015/0257022 | A1* | 9/2015 | Kohlmann | H04B 1/16 |
| | | | | 455/550.1 |
| 2015/0333718 | A1* | 11/2015 | Lemkin | H03G 3/20 |
| | | | | 455/234.1 |
| 2015/0349755 | A1* | 12/2015 | van Sinderen | H03K 3/0315 |
| | | | | 331/45 |
| 2017/0207801 | A1* | 7/2017 | Ashry Othman | H04B 1/0475 |
| 2017/0222709 | A1* | 8/2017 | Zhang | H03F 3/45475 |
| 2018/0048339 | A1* | 2/2018 | Wu | H04B 1/1036 |
| 2019/0215028 | A1* | 7/2019 | Mccullagh | H04B 1/0057 |
| 2021/0119671 | A1* | 4/2021 | Jung | H04B 5/0081 |

* cited by examiner

RECEIVER CIRCUITS WITH BLOCKER ATTENUATING MIXER

FIELD OF THE INVENTION

The present application generally pertains to receiver circuits, and more particularly to receiver circuits which attenuate blocker signals.

BACKGROUND OF THE INVENTION

High power signals near the signal frequency are problematic for receivers, as they make it difficult for the receiver to correctly receive the transmitted signal information. Circuit techniques for attenuating blocker signals are needed in the art.

BRIEF SUMMARY OF THE INVENTION

One inventive aspect is a receiver circuit. The receiver circuit includes an amplifier having an input terminal, where the amplifier is configured to generate an RF signal based on a signal received at the input terminal, where the RF signal includes an information signal and a blocker signal modulating an RF carrier frequency. The receiver circuit also includes a mixer configured to receive the RF signal and to downconvert the RF signal to generate a baseband signal, where the baseband signal includes the information signal and the blocker signal modulating a baseband carrier frequency, where the baseband carrier frequency is less than the RF carrier frequency, and where the mixer is further configured to selectively attenuate the blocker signal.

DETAILED DESCRIPTION OF THE INVENTION

Particular embodiments of the invention are illustrated herein in conjunction with the drawings.

Various details are set forth herein as they relate to certain embodiments. However, the invention can also be implemented in ways which are different from those described herein.

Modifications can be made to the discussed embodiments by those skilled in the art without departing from the invention. Therefore, the invention is not limited to particular embodiments disclosed herein.

Figure 1:
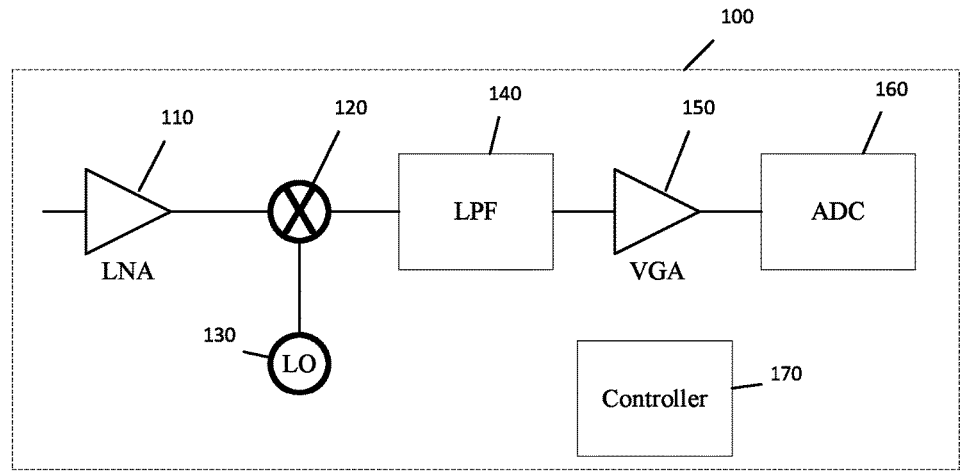
FIG. 1 is a schematic diagram of an embodiment of a receiver circuit.

FIG. 1 is a schematic diagram of an embodiment of a receiver circuit 100. Receiver circuit 100 includes low noise amplifier (LNA) 110, mixer 120 which receives an oscillator signal from oscillator 130, low-pass filter (LPF) 140, variable gain amplifier (VGA) 150, analog-to-digital converter (ADC) 160, and controller 170.

Low noise amplifier 110 is configured to receive a high-frequency carrier signal modulated with a low frequency information signal. The received signal may also include a blocker signal, such as an unrelated signal, distinct from the information signal, having a frequency near, but outside the frequency bandwidth of the receiver, where the unrelated signal also modulates the high-frequency carrier signal. The blocker signal may have higher power than the information signal. Low noise amplifier 110 may be any low noise amplifier or amplifier, as understood by those of skill in the art.

In response to the output from the low noise amplifier 110 and the oscillator signal, mixer 120 down converts the signal from the low noise amplifier 110. The resulting baseband signal includes information of the low frequency information signal and of the blocker signal.

The baseband signal is then processed by the low-pass filter 140. Because of the blocker signal, signals at the low-pass filter 140 may exceed an input or output range limit, such that signals at the input, the output, or internal to the low-pass filter 140 experience clipping, as understood by those of skill in the art. Using techniques known to those of skill in the art, the clipping may be detected, and communicated to controller 170. In response to the detected clipping, controller 170 may generate control signals for low-pass filter 140 to attenuate the baseband signal such that the signal range limit is no longer exceeded, and the clipping stops.

In some embodiments, the low-pass filter 140 does not detect whether the baseband signal exceeds a signal range limit.

The baseband signal is then processed by the variable gain amplifier 150. Because of the blocker signal, signals at the variable gain amplifier 150 may exceed an input or output range limit, such that signals at the input, the output, or internal to the variable gain amplifier 150 experience clipping. Using techniques known to those of skill in the art, the clipping may be detected, and communicated to controller 170. In response to the detected clipping, controller 170 may generate control signals for variable gain amplifier 150 to attenuate the baseband signal such that the signal range limit is no longer exceeded, and the clipping stops. Additionally or alternatively, in response to the detected clipping, controller 170 may generate control signals for low-pass filter 140 to attenuate the baseband signal such that the signal range limit is no longer exceeded, and the clipping stops.

In some embodiments, variable gain amplifier 150 does not detect whether the baseband signal exceeds a signal range limit.

The baseband signal is then processed by the analog-to-digital converter 160. Because of the blocker signal, signals at the analog-to-digital converter 160 may exceed an input or output range limit, such that signals at the input, the output, or internal to the analog-to-digital converter 160 experience clipping. Using techniques known to those of skill in the art, the clipping may be detected, and communicated to controller 170. In response to the detected clipping, controller 170 may generate control signals for analog-to-digital converter 160 to attenuate the baseband signal such that the signal range limit is no longer exceeded, and the clipping stops. Additionally or alternatively, in response to the detected clipping, controller 170 may generate control signals for variable gain amplifier 150 to attenuate the baseband signal such that the signal range limit is no longer exceeded, and the clipping stops. Additionally or alternatively, in response to the detected clipping, controller 170 may generate control signals for low-pass filter 140 to attenuate the baseband signal such that the signal range limit is no longer exceeded, and the clipping stops.

In some embodiments, the analog-to-digital converter 160 does not detect whether the baseband signal exceeds a signal range limit.

As understood by those of skill in the art, the control signals from controller 170 may cause one or more gain elements to attenuate the blocker signal. Additionally or alternatively, as understood by those of skill in the art, the control signals from controller 170 may cause one or more filtering elements to filter the blocker signal by, for example, moving a pole of the one or more filtering elements.

Figure 2:
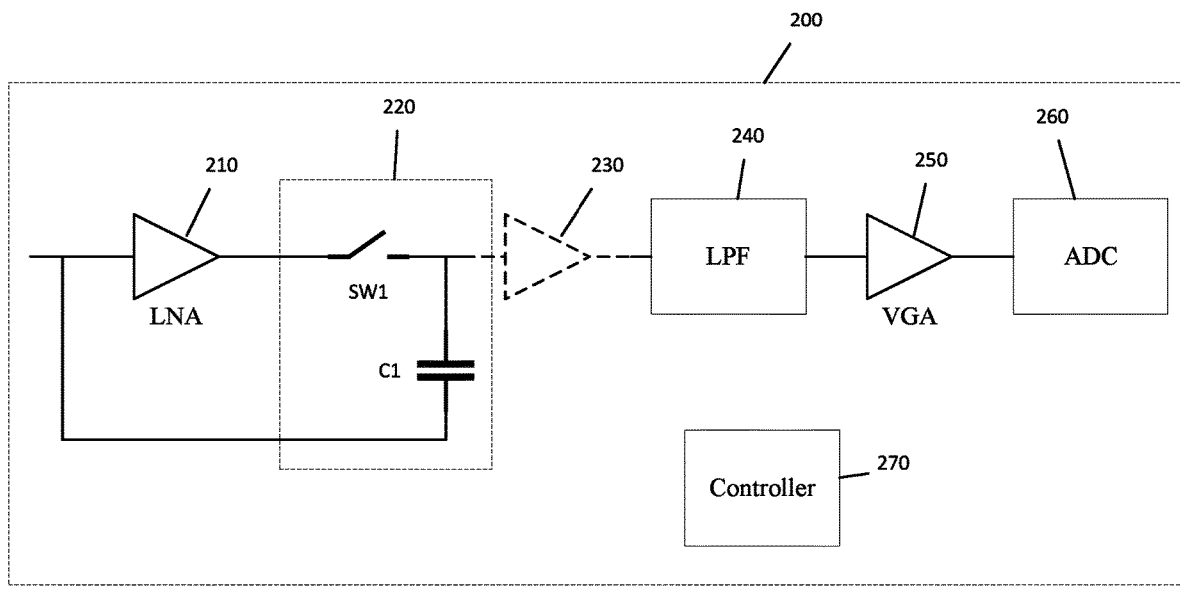
FIG. 2 is a schematic diagram of another embodiment of a receiver circuit.

FIG. 2 is a schematic diagram of another embodiment of a receiver circuit 200. Receiver 200 includes low noise amplifier (LNA) 210, mixer and low pass filter (mixer/bpf) 220, optional buffer 230, low-pass filter (LPF) 240, variable gain amplifier (VGA) 250, analog-to-digital converter (ADC) 260, and controller 270.

Low noise amplifier 210 is configured to receive a high-frequency carrier signal modulated with a low frequency information signal as filtered by filter 280. In some embodiments, the filtering of filter 280 is sufficient, that a SAW filter (or other similar) filter is not used to filter the high-frequency carrier signal prior to its being received by receiver 200.

In some embodiments, low noise amplifier 210 includes a matching network, as understood by those of skill in the art. In some embodiments, the high-frequency carrier signal an output of a matching network, as understood by one of skill in the art.

The received signal may also include a blocker signal, such as a high power signal also modulating the high-frequency carrier signal near the frequency of the information signal. Low noise amplifier 210 may be any low noise amplifier or amplifier, as understood by those of skill in the art.

In response to the output from the low noise amplifier 210, and control signals from controller 270, mixer/bpf 220 down converts and band pass filters the signal from the low noise amplifier 210. In some embodiments, the resulting initial baseband signal includes information of the low frequency information signal and of the blocker signal.

The baseband signal may then be processed by optional buffer 230. Because of the blocker signal, signals at the optional buffer 230 may exceed an input or output range limit, such that signals at the input, the output, or internal to the optional buffer 230 experience clipping. Using techniques known to those of skill in the art, the clipping may be detected, and communicated to controller 270. In response to the detected clipping, controller 270 may generate control signals for optional buffer 230 to attenuate the baseband signal such that the signal range limit is no longer exceeded, and the clipping stops. Additionally or alternatively, in response to the detected clipping, controller 270 may generate control signals for mixer/bpf 220 which cause mixer/bpf 220 to attenuate the baseband signal such that the signal range limit is no longer exceeded, and the clipping stops.

In some embodiments, the optional buffer 230 does not detect whether the baseband signal exceeds a signal range limit.

The baseband signal is then processed by the low-pass filter 240. Because of the blocker signal, signals at the low-pass filter 240 may exceed an input or output range limit, such that signals at the input, the output, or internal to the low-pass filter 240 experience clipping. Using techniques known to those of skill in the art, the clipping may be detected, and communicated to controller 270. In response to the detected clipping, controller 270 may generate control signals for low-pass filter 240 to attenuate the baseband signal such that the signal range limit is no longer exceeded, and the clipping stops. Additionally or alternatively, response to the detected clipping, controller 270 may generate control signals for optional buffer 230 to attenuate the baseband signal such that the signal range limit is no longer exceeded, and the clipping stops. Additionally or alternatively, in response to the detected clipping, controller 270 may generate control signals for mixer/bpf 220 which cause mixer/bpf 220 to attenuate the baseband signal such that the signal range limit is no longer exceeded, and the clipping stops.

In some embodiments, the low-pass filter 240 does not detect whether the baseband signal exceeds a signal range limit.

The baseband signal is then processed by the variable gain amplifier 250. Because of the blocker signal, signals at the variable gain amplifier 250 may exceed an input or output range limit, such that signals at the input, the output, or internal to the variable gain amplifier 250 experience clipping. Using techniques known to those of skill in the art, the clipping may be detected, and communicated to controller 270. In response to the detected clipping, controller 270 may generate control signals for variable gain amplifier 250 to attenuate the baseband signal such that the signal range limit is no longer exceeded, and the clipping stops. Additionally or alternatively, in response to the detected clipping, controller 270 may generate control signals for low-pass filter 240 to attenuate the baseband signal such that the signal range limit is no longer exceeded, and the clipping stops. Additionally or alternatively, response to the detected clipping, controller 270 may generate control signals for optional buffer 230 to attenuate the baseband signal such that the signal range limit is no longer exceeded, and the clipping stops. Additionally or alternatively, in response to the detected clipping, controller 270 may generate control signals for mixer/bpf 220 which cause mixer/bpf 220 to attenuate the baseband signal such that the signal range limit is no longer exceeded, and the clipping stops.

In some embodiments, variable gain amplifier 250 does not detect whether the baseband signal exceeds a signal range limit.

The baseband signal is then processed by the analog-to-digital converter 260. Because of the blocker signal, signals at the analog-to-digital converter 260 may exceed an input or output range limit, such that signals at the input, the output, or internal to the analog-to-digital converter 260 experience clipping. Using techniques known to those of skill in the art, the clipping may be detected, and communicated to controller 270. In response to the detected clipping, controller 270 may generate control signals for analog-to-digital converter 260 to attenuate the baseband signal such that the signal range limit is no longer exceeded, and the clipping stops. Additionally or alternatively, in response to the detected clipping, controller 270 may generate control signals for variable gain amplifier 250 to attenuate the baseband signal such that the signal range limit is no longer exceeded, and the clipping stops. Additionally or alternatively, in response to the detected clipping, controller 270 may generate control signals for low-pass filter 240 to attenuate the baseband signal such that the signal range limit is no longer exceeded, and the clipping stops. Additionally or alternatively, response to the detected clipping, controller 270 may generate control signals for optional buffer 230 to attenuate the baseband signal such that the signal range limit is no longer exceeded, and the clipping stops. Additionally or alternatively, in response to the detected clipping, controller 270 may generate control signals for mixer/bpf 220 which cause mixer/bpf 220 to attenuate the baseband signal such that the signal range limit is no longer exceeded, and the clipping stops.

In some embodiments, the analog-to-digital converter 260 does not detect whether the baseband signal exceeds a signal range limit.

As understood by those of skill in the art, the control signals from controller 270 may cause one or more gain elements to attenuate the blocker signal. Additionally or alternatively, as understood by those of skill in the art, the control signals from controller 270 may cause one or more filtering elements to filter the blocker signal by, for example, moving a pole of the one or more filtering elements.

Figure 3:
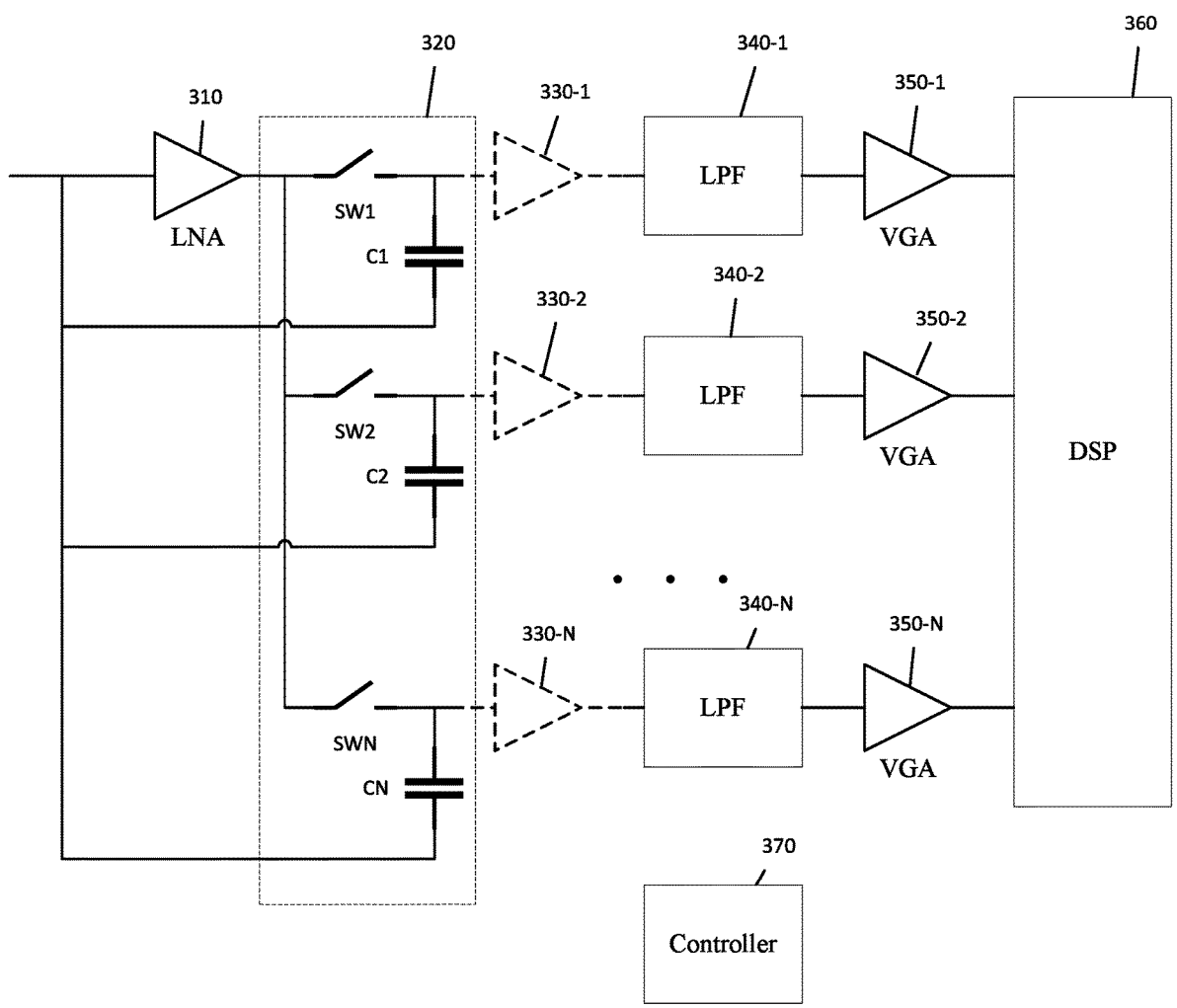
FIG. 3 is a schematic diagram of yet another embodiment of a receiver circuit.

FIG. 3 is a schematic diagram of yet another embodiment of a receiver circuit 300. Receiver 300 includes low noise amplifier (LNA) 310, multi-phase mixer and low pass filter (mixer/bpf) 320, optional buffers 330-1, 330-2 . . . 330-N, low-pass filters (LPF) 340-1, 340-2 . . . 340-N, combiner 390, variable gain amplifiers (VGA) 350-1, 350-2 . . . 350-N, digital signal processor (DSP) 360, and controller 370.

Low noise amplifier 310 is configured to receive a high-frequency carrier signal modulated with a low frequency information signal as filtered by filter 380. In some embodiments, the filtering of filter 380 is sufficient, that a SAW filter (or other similar) filter is not used to filter the high-frequency carrier signal prior to its being received by receiver 300.

In some embodiments, low noise amplifier 310 includes a matching network, as understood by those of skill in the art. In some embodiments, the high-frequency carrier signal an output of a matching network, as understood by one of skill in the art.

The received high-frequency carrier signal may also include a blocker signal, such as a high power signal also modulating the high-frequency carrier signal near the frequency of the information signal. Low noise amplifier 310 may be any low noise amplifier or amplifier, as understood by those of skill in the art.

In response to the output from the low noise amplifier 310, and control signals from controller 370, multi-phase mixer/bpf 320 down converts and filters the signal from the low noise amplifier 310. In some embodiments, the resulting initial baseband signals include information of the low frequency information signal and of the blocker signal.

The baseband signals may then be processed by optional buffers 330-1, 330-2 . . . 330-N, which buffer the signals, as understood by those of ordinary skill in the art. Because of the blocker signal, signals at the optional buffers 330-1, 330-2 . . . 330-N may exceed an input or output range limit, such that signals at the inputs, the outputs, or internal to the optional buffers 330-1, 330-2 . . . 330-N experience clipping. Using techniques known to those of skill in the art, the clipping may be detected, and communicated to controller 370. In response to the detected clipping, controller 370 may generate control signals for optional buffers 330-1, 330-2 . . . 330-N to attenuate the baseband signals such that the signal range limit is no longer exceeded, and the clipping stops. Additionally or alternatively, in response to the detected clipping, controller 370 may generate control signals for multi-phase mixer/bpf 320 which cause multi-phase mixer/bpf 320 to attenuate the baseband signals such that the signal range limit is no longer exceeded, and the clipping stops.

In some embodiments, optional buffers 330-1, 330-2 . . . 330-N do not detect whether the baseband signal exceeds a signal range limit.

The baseband signals are then processed by the low-pass filters 340-1, 340-2 . . . 340-N, which filter the signals, as understood by those of ordinary skill in the art. Because of the blocker signal, signals at the low-pass filters 340-1, 340-2 . . . 340-N may exceed an input or output range limit, such that signals at the input, the output, or internal to the low-pass filters 340-1, 340-2 . . . 340-N experience clipping. Using techniques known to those of skill in the art, the clipping may be detected, and communicated to controller 370. In response to the detected clipping, controller 370 may generate control signals for low-pass filters 340-1, 340-2 . . . 340-N to attenuate the baseband signal such that the signal range limit is no longer exceeded, and the clipping stops. Additionally or alternatively, response to the detected clipping, controller 370 may generate control signals for optional buffers 330-1, 330-2 . . . 330-N to attenuate the baseband signal such that the signal range limit is no longer exceeded, and the clipping stops. Additionally or alternatively, in response to the detected clipping, controller 370 may generate control signals for multi-phase mixer/bpf 320 which cause multi-phase mixer/bpf 320 to attenuate the baseband signals such that the signal range limit is no longer exceeded, and the clipping stops.

In some embodiments, the low-pass filters 340-1, 340-2 . . . 340-N do not detect whether the baseband signal exceeds a signal range limit.

The baseband signals are then processed by the combiner 390, which combines the signals to generate baseband I and Q signals, using techniques such as weighted harmonic rejection, as understood by those of ordinary skill in the art. Other combining techniques may be used. Because of the blocker signal, signals at the combiner 390 may exceed an input or output range limit, such that signals at the input, the output, or internal to the combiner 390 experience clipping. Using techniques known to those of skill in the art, the clipping may be detected, and communicated to controller 370. In response to the detected clipping, controller 370 may generate control signals for combiner 390 to attenuate the baseband signal such that the signal range limit is no longer exceeded, and the clipping stops. Additionally or alternatively, in response to the detected clipping, controller 370 may generate control signals for low-pass filters 340-1, 340-2 . . . 340-N to attenuate the baseband signal such that the signal range limit is no longer exceeded, and the clipping stops. Additionally or alternatively, in response to the detected clipping, controller 370 may generate control signals for optional buffers 330-1, 330-2 . . . 330-N to attenuate the baseband signal such that the signal range limit is no longer exceeded, and the clipping stops. Additionally or alternatively, in response to the detected clipping, controller 370 may generate control signals for multi-phase mixer 320 which cause multi-phase mixer 320 to attenuate the baseband signals such that the signal range limit is no longer exceeded, and the clipping stops. Additionally or alternatively, in response to the detected clipping, controller 370 may generate control signals for low-pass filter 380 which cause low-pass filter 380 to attenuate the high-frequency carrier signal such that the signal range limit is no longer exceeded, and the clipping stops.

In some embodiments, using circuitry understood by those of skill in the art, the functionality of low-pass filters 340-1, 340-2 . . . 340-N may be included in combiner 390, such that a low-pass filter/combiner circuit receives baseband signals from either the multi-phase mixer 320 or the optional buffers 330-1, 330-2 . . . 330-N, and both filters the baseband signals, and generates corresponding I and Q signals.

The baseband I and Q signals are then processed by the variable gain amplifiers 350-1 and 350-2. Because of the blocker signal, signals at the variable gain amplifiers 350-1 and 350-2 may exceed an input or output range limit, such that signals at the input, the output, or internal to the variable gain amplifiers 350-1 and 350-2 experience clipping. Using techniques known to those of skill in the art, the clipping may be detected, and communicated to controller 370. In response to the detected clipping, controller 370 may generate control signals for variable gain amplifiers 350-1 and 350-2 to attenuate the baseband signal such that the signal range limit is no longer exceeded, and the clipping stops. Additionally or alternatively, in response to the detected clipping, controller 370 may generate control signals for combiner 390 to attenuate the baseband signal such that the signal range limit is no longer exceeded, and the clipping stops. Additionally or alternatively, in response to the detected clipping, controller 370 may generate control signals for low-pass filters 340-1, 340-2 . . . 340-N to attenuate the baseband signal such that the signal range limit is no longer exceeded, and the clipping stops. Additionally or alternatively, in response to the detected clipping, controller 370 may generate control signals for optional buffers 330-1, 330-2 . . . 330-N to attenuate the baseband signal such that the signal range limit is no longer exceeded, and the clipping stops. Additionally or alternatively, in response to the detected clipping, controller 370 may generate control signals for multi-phase mixer/bpf 320 which cause multi-phase mixer/bpf 320 to attenuate the baseband signal such that the signal range limit is no longer exceeded, and the clipping stops.

In some embodiments, variable gain amplifiers 350-1 and 350-2 do not detect whether the baseband signal exceeds a signal range limit.

The baseband signals are then processed by the digital signal processor 360. Because of the blocker signal, signals at the digital signal processor 360 may exceed an input or output range limit, such that signals at the input, the output, or internal to the digital signal processor 360 experience clipping. Using techniques known to those of skill in the art, the clipping may be detected, and communicated to controller 370. In response to the detected clipping, controller 370 may generate control signals for digital signal processor 360 to attenuate the baseband signal such that the signal range limit is no longer exceeded, and the clipping stops. Additionally or alternatively, in response to the detected clipping, controller 370 may generate control signals variable gain amplifiers 350-1 and 350-2 to attenuate the baseband signal such that the signal range limit is no longer exceeded, and the clipping stops. Additionally or alternatively, in response to the detected clipping, controller 370 may generate control signals for low-pass filters 340-1, 340-2 . . . 340-N to attenuate the baseband signal such that the signal range limit is no longer exceeded, and the clipping stops. Additionally or alternatively, response to the detected clipping, controller 370 may generate control signals for optional buffers 330-1, 330-2 . . . 330-N to attenuate the baseband signal such that the signal range limit is no longer exceeded, and the clipping stops. Additionally or alternatively, in response to the detected clipping, controller 370 may generate control signals for multi-phase mixer/bpf 320 which cause multi-phase mixer/bpf 320 to attenuate the baseband signal such that the signal range limit is no longer exceeded, and the clipping stops.

In some embodiments, the digital signal processor 360 does not detect whether the baseband signal exceeds a signal range limit.

As understood by those of skill in the art, the control signals from controller 370 may cause one or more gain elements to attenuate the blocker signal. Additionally or alternatively, as understood by those of skill in the art, the control signals from controller 370 may cause one or more filtering elements to filter the blocker signal by, for example, moving a pole of the one or more filtering elements.

Though the present invention is disclosed by way of specific embodiments as described above, those embodiments are not intended to limit the present invention. Based on the methods and the technical aspects disclosed herein, variations and changes may be made to the presented embodiments by those of skill in the art without departing from the spirit and the scope of the present invention.

What is claimed is:

1. A receiver circuit, comprising:
an amplifier comprising:
an input terminal, and
an output terminal,
wherein the amplifier is configured to generate an RF signal at the output terminal based on a signal received at the input terminal, wherein the RF signal comprises an information signal and a blocker signal modulating an RF carrier frequency; and
a mixer having a switch directly connected to the output terminal of the amplifier and having a capacitor directly connected to the switch and directly connected to the input terminal of the amplifier, wherein the mixer is configured to receive the RF signal, to low pass filter the RF signal, and to downconvert the RF signal to generate a baseband signal, wherein the baseband signal comprises the information signal and the blocker signal modulating a baseband carrier frequency, wherein the baseband carrier frequency is less than the RF carrier frequency, and wherein the mixer is further configured to selectively attenuate the blocker signal.

2. The receiver circuit of claim 1, wherein the amplifier comprises a low noise amplifier.

3. The receiver circuit of claim 1, wherein the mixer comprises a multiphase mixer.

4. The receiver circuit of claim 1, wherein the mixer is configured to attenuate the blocker signal in response to a control signal.

5. The receiver circuit of claim 4, further comprising another circuit, wherein the another circuit is configured to detect the blocker signal, and to generate the control signal in response to the blocker signal being detected.

6. The receiver circuit of claim 5, wherein the another circuit comprises a variable gain amplifier configured to generate the control signal in response to one or more signals at the variable gain amplifier exceeding an input or output range limit.

7. The receiver circuit of claim 6, further comprising a controller configured to receive the control signal from the variable gain amplifier and to generate one or more controlling signals for the mixer, wherein, in response to the controlling signals, the mixer is configured to attenuate the blocker signal.

8. The receiver circuit of claim 5, wherein the another circuit comprises an analog-to-digital converter configured to generate the control signal in response to one or more signals at the analog-to-digital converter exceeding an input or output range limit.

9. The receiver circuit of claim 8, further comprising a controller configured to receive the control signal from the analog-to-digital converter and to generate one or more controlling signals for the mixer, wherein, in response to the controlling signals, the mixer is configured to attenuate the blocker signal.

10. A method of operating a receiver circuit, the receiver circuit comprising:

an amplifier comprising an input terminal and an output terminal; and a mixer, comprising a switch directly connected to the output terminal of the amplifier, and comprising a capacitor directly connected to the switch and directly connected to the input terminal of the amplifier, the method comprising:

with the amplifier, generating an RF signal at the output terminal based on a signal received at the input terminal, wherein the RF signal comprises an information signal and a blocker signal modulating an RF carrier frequency;

with the mixer, receiving the RF signal directly from the amplifier;

with the mixer, low pass filtering the RF signal;

with the mixer, downconverting the RF signal to generate a baseband signal, wherein the baseband signal comprises the information signal and the blocker signal modulating a baseband carrier frequency, wherein the baseband carrier frequency is less than the RF carrier frequency; and with the mixer, selectively attenuating the blocker signal.

11. The method of claim 10, wherein the amplifier comprises a low noise amplifier.

12. The method of claim 10, wherein the mixer comprises a multiphase mixer.

13. The method of claim 10, further comprising, with the mixer, attenuating the blocker signal in response to a control signal.

14. The method of claim 13, wherein the receiver circuit further comprises another circuit, and wherein the method further comprises:

with the another circuit, detecting the blocker signal; and with the another circuit, generating the control signal in response to the blocker signal being detected.

15. The method of claim 14, wherein the another circuit comprises a variable gain amplifier, and wherein the method further comprises, with the variable gain amplifier, generating the control signal in response to one or more signals at the variable gain amplifier exceeding an input or output range limit.

16. The method of claim 15, wherein the receiver circuit further comprises a controller, and wherein the method further comprises:

with the controller, receiving the control signal from the variable gain amplifier;

with the controller, in response to the control signal, generating one or more controlling signals for the mixer; and with the mixer, in response to the controlling signals, attenuating the blocker signal.

17. The method of claim 14, wherein the another circuit comprises an analog-to-digital converter, and wherein the method further comprises, with the analog-to-digital converter, generating the control signal in response to one or more signals at the analog-to-digital converter exceeding an input or output range limit.

18. The method of claim 17, wherein the receiver circuit further comprises a controller, and wherein the method further comprises:

with the controller, receiving the control signal from the analog-to-digital converter;

with the controller, in response to the control signal, generating one or more controlling signals for the mixer; and with the mixer, in response to the controlling signals, attenuating the blocker signal.

\* \* \* \* \*